United States Patent
Kropelnicki et al.

(10) Patent No.: US 9,915,567 B2
(45) Date of Patent: Mar. 13, 2018

(54) UNRELEASED THERMOPILE INFRARED SENSOR USING MATERIAL TRANSFER METHOD

(71) Applicant: Excelitas Technologies Singapore Pte Ltd., Singapore (SG)

(72) Inventors: Piotr Kropelnicki, Nusajaya (MY); Radu M. Marinescu, Pointe-Claire (CA); Grigore D. Huminic, Baie D'Urfe (CA); Hermann Karagoezoglu, Wiesbaden (DE); Kai Liang Chuan, Singapore (SG)

(73) Assignee: Excelitas Technologies Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/194,753

(22) Filed: Jun. 28, 2016

(65) Prior Publication Data

US 2017/0370779 A1    Dec. 28, 2017

(51) Int. Cl.
*G01J 5/20* (2006.01)
*G01J 5/12* (2006.01)
(Continued)

(52) U.S. Cl.
CPC ............... *G01J 5/12* (2013.01); *G01J 5/061* (2013.01); *H01L 31/09* (2013.01);
(Continued)

(58) Field of Classification Search
CPC ...... G01J 5/12; G01J 5/046; G01J 5/02; G01J 5/16; G01J 2005/065; G01J 5/061;
(Continued)

(56) References Cited

U.S. PATENT DOCUMENTS 4,935,345 A * 6/1990 Guilbeau ........... A61B 5/14865
                                                    435/14
8,758,650 B2   6/2014 Marinescu et al.
(Continued)

FOREIGN PATENT DOCUMENTS

DE   102010031829   2/2011
WO   2010147532     12/2010

OTHER PUBLICATIONS

Mohammad J. Modarres-Zadeh, et al; "Parylene supported 20um*20um uncooled thermoelectric infrared detector with high fill fastor"; Infrared Technology and Applications XXXVIII, edited by Bjørn F. Andresen, Gabor F. Fulop, Paul R. Norton, Proc. of SPIE vol. 8353, 83531K; Apr.-May 2012.
(Continued)

*Primary Examiner* — David J Makiya
*Assistant Examiner* — Taeho Jo
(74) *Attorney, Agent, or Firm* — Peter A. Nieves; Sheehan Phinney Bass & Green PA

(57) ABSTRACT

An unreleased thermopile IR sensor and method of fabrication is provided which includes a new thermally isolating material and an ultra-thin material based sensor which, in combination, provide excellent sensitivity without requiring a released membrane structure. The sensor is fabricated using a wafer transfer technique in which a substrate assembly comprising the substrate and new thermally isolating material is bonded to a carrier substrate assembly comprising a carrier substrate and the ultra-thin material, followed by removal of the carrier substrate. As such, temperature restrictions of the various materials are overcome.

21 Claims, 5 Drawing Sheets

(51) Int. Cl.
*G01J 5/06* (2006.01)
*H01L 31/09* (2006.01)
*H01L 35/32* (2006.01)
*H01L 35/34* (2006.01)
*H01L 31/18* (2006.01)

(52) U.S. Cl.
CPC ...... *H01L 31/1804* (2013.01); *H01L 31/1828* (2013.01); *H01L 31/1856* (2013.01); *H01L 35/32* (2013.01); *H01L 35/34* (2013.01); *G01J 2005/065* (2013.01)

(58) Field of Classification Search
CPC . G01L 31/09; G01L 31/1804; G01L 31/1828; G01L 31/1856; G01L 35/32; G01L 35/35
USPC ...................................................... 250/338.4
See application file for complete search history.

(56) References Cited

U.S. PATENT DOCUMENTS

| | | | |
|---|---|---|---|
| 2004/0113076 A1* | 6/2004 | Guo | G01H 11/08 250/338.1 |
| 2005/0012040 A1* | 1/2005 | Fiorini | B81C 1/00666 250/338.4 |
| 2006/0060788 A1 | 3/2006 | Uchida et al. | |
| 2011/0254142 A1* | 10/2011 | Wang | H01L 21/0271 257/642 |
| 2013/0069194 A1* | 3/2013 | Marinescu | G01J 5/046 257/467 |
| 2013/0248712 A1 | 9/2013 | Abdolvand et al. | |
| 2014/0036953 A1* | 2/2014 | Kimura | G01J 5/16 374/121 |
| 2014/0246749 A1* | 9/2014 | Nam | H01L 27/16 257/467 |
| 2014/0291521 A1* | 10/2014 | Rossinger | G01J 5/0205 250/338.4 |
| 2014/0369386 A1* | 12/2014 | Radhakrishnan | G01K 7/02 374/179 |
| 2015/0054114 A1* | 2/2015 | Quad | G01J 5/0225 257/467 |
| 2015/0137304 A1* | 5/2015 | Mao | G01J 5/022 257/467 |
| 2016/0079306 A1* | 3/2016 | Kropelnicki | H01L 27/16 257/467 |
| 2016/0097681 A1* | 4/2016 | Buchan | G01J 5/045 250/338.4 |
| 2016/0282194 A1* | 9/2016 | Barnett | H01L 35/32 |

OTHER PUBLICATIONS

Kaoru Narita, et al; "A plastic-based bolometer array sensor uging carbon nanotubes for low-cost infrared imaging devices"; Sensors and Actuators A: Physical; vol. A195, Jun. 2013 (Available online Mar. 16, 2013).

Joel Barreto; "Experimental Design for Estimating Electro-Thermophysical Properties of a Thermopile Thermal Radiation Detector"; Thesis Submitted to Virginia Polytechnic Institute and State University; Jul. 16, 1998.

A.T. Ciftlik and M.A.M. Gijs; Low Temperature Pyrex/Silicon Wafer Bonding via a Single Intermediate Parylene Layer; Transducers'11, Beijing, China, Jun. 5-9, 2011.

Yushi Yokomizo; "Giant Seebeck coefficient of the graphene/h-BN superlattices"; Applied Physics Letters 103, 113901 (2013).

Michele Buscema; "Large and Tunable Photothermoelectric Effect in Single-Layer MoS2"; ACS Publications; Nano Lett. 2013, 13, 358-363, published Jan. 9, 2013.

Huchuan Zhou et al, "Paper; Development of a Thermopile Infrared Sensor Using Stacked Double Polycrystalline Silicon Layers Based on the CMOS Process; Development of a Thermopile Infrared Sensor Using Stacked Double Polycrystalline Silicon Layers Based on the CMOS Process"; Journal of Micromechanics & Microengineering, Institute of Physics Publishing, Bristol GB, vol. 23, No. 6, May 13, 2013.

Huchuan Zhou, "Development of Mems Thermopiles and Related Applications", Aug. 20, 2014

Huchuan Zhou et al, "Characterization of Nanometric-Thick Polycrystalline Silicon with Phonon-boundary Scattering Enhanced Thermoelectric Properties and its Application in Infrared Sensors" Nanoscale, vol. 7 No. 2, Jan. 1, 2015.

Extended European Search Report for Application 17177692.5 dated Dec. 14, 2017.

* cited by examiner

UNRELEASED THERMOPILE INFRARED SENSOR USING MATERIAL TRANSFER METHOD

FIELD OF THE INVENTION

The present invention generally relates to infrared sensors and material transfer methods of fabrication, and more particularly to unreleased thermopile infrared sensors comprising a combination of an ultra-thin material that is deposited at heightened temperatures and new thermally isolating materials.

BACKGROUND

A thermopile is an infrared radiation (IR) detector commonly used for making non-contact temperature measurements. For example, thermopiles are used in ear thermometers, proximity sensors, heat flux sensors, and the like. Thermopiles are made up of a series of electrically connected thermocouple pairs, each pair made up of dissimilar conducting or semi-conducting materials with different Seebeck coefficients. For example, N-type poly-silicon and P-type poly-silicon are often used in conventional thermopiles.

Generally, one end of each thermocouple is placed in contact with a membrane operable to collect IR energy while the other end is placed on a supporting substrate. The collected IR energy creates a temperature gradient across the thermocouple, causing the thermocouple to generate an output voltage via the Seebeck effect. For a thermocouple having known characteristics, the output voltage may be converted into a temperature value.

However, since the output voltage of a thermocouple is relatively small, efforts have been made to provide designs and methods that are capable of maximizing the heat trapped within the membrane and therefore enhance the signal. Such efforts have included the use of vacuum packaging, significantly increasing the membrane area, as well as providing a suspended ("released") membrane to provide for thermal isolation. For example, one typical process involves using low-pressure chemical-vapor deposition (LPCVD) methods to deposit a membrane material (e.g., silicon nitride, polycrystalline silicon) onto a substrate (e.g., silicon) after depositing a sacrificial layer (e.g., an LPCVD or thermally grown silicon oxide layer). The sacrificial layer is later removed by wet etching via etch holes to thereby create a cavity over which the sensor is suspended and supported by the membrane. This suspension process can also be referred to as "releasing" the membrane. In addition, because the heat from the membrane can dissipate through the air surrounding the exposed membrane, a vacuum may be created within the cavity to further reduce heat loss via conduction and convection.

While such sensor designs provide the desired enhanced signals, very extensive process steps are necessary in order to form the suspended membrane, which generally requires eight or more mask layers within a CMOS process. This comes along with a significant decrease of yield and an increase of manufacturing time and costs. In addition, the suspended membrane is fragile and may be prone to tearing and damage due to handling, thus resulting in further decreased yield and increased manufacturing time and costs.

Non-suspended ("unreleased") thermopile IR sensors have been developed, but they have suffered from a low Figure of Merit (FOM) due to the low temperature budget of the utilized thermally isolating materials which can be used for IR sensing. In addition, proposed materials that could potentially offer enhanced sensitivity are generally not CMOS compatible due to their instability at the heightened temperatures at which CMOS is carried out. As such, the suspended sensor and membrane structure has generally been the standard in achieving heightened sensitivity.

It would be desirable to overcome the complexity of the manufacturing process for thermopile IR sensors, thereby reducing manufacturing time and expense and increasing yield. It would further be desirable to provide fabrication methods and sensor designs which allow for more structurally stable configurations that are less prone to damage, while still achieving the necessary enhanced signals.

SUMMARY OF INVENTION

Aspects of the present invention are directed to an unreleased thermopile infrared sensor comprising a substrate having a bottom surface and a top surface; a thermally isolating material disposed on at least a portion of the top surface of the substrate, the thermally isolating material having a bottom surface and a top surface; and an ultra-thin material disposed on at least a portion of the top surface of the thermally isolating material; wherein the thermally isolating material is stable at temperatures up to 450° C., and wherein the ultra-thin material is selected from materials having a thickness of less than or equal to 200 nm, and are deposited by methods requiring a heightened temperature of greater than 450° C.

In some embodiments, the thermally isolating material is selected from Parylene, benzocyclobutene (BCB), amorphous fluoropolymers, poly(methyl methacrylate), SU-8 photo-resists, and other polymers. In some embodiments, the ultra-thin material is selected from 2D materials. In some embodiments, the ultra-thin material is selected from the group consisting of graphene, $MoS_2$, SnSe, black phosphorus (BP), thin poly-silicon, SiGe (silicon germanium), Ge (germanium), boron nitride (BN), group III-V compound semiconductors, group II-VI compound semiconductors, and combinations thereof. In some embodiments, the unreleased thermopile infrared sensor further comprises a second ultra-thin material disposed on at least another portion of the top surface of the thermally isolating material. In some embodiments, the substrate is selected from a silicon wafer, a CMOS wafer, a printed circuit board, or a flexible substrate that is unstable at temperatures in excess of 450° C.

According to another aspect, the present invention is directed to an unreleased thermopile infrared sensor comprising a Parylene material disposed between a 2D material based sensor and a substrate, wherein the Parylene material is stable at temperatures up to 450° C., and the 2D material is deposited by methods requiring a heightened temperature of greater than 450° C.

In some embodiments, the substrate is selected from a silicon wafer, a CMOS wafer, a printed circuit board, or a flexible substrate that is unstable at temperatures in excess of 450° C.

According to another aspect, the present invention is directed to a method for fabricating an unreleased thermopile infrared sensor comprising (a) forming a substrate assembly by providing a substrate layer having a bottom surface and a top surface, and depositing a thermally isolating material layer on at least a portion of the top surface of the substrate layer; (b) forming a carrier assembly by providing a carrier layer having a bottom surface and a top surface, optionally depositing a sacrificial layer on at least a portion of the top surface of the carrier layer, depositing an ultra-thin material layer on at least a portion of the sacrificial layer or on at least a portion of the top surface of the carrier layer, and optionally depositing a bonding layer on the ultra-thin material; (c) stacking the carrier assembly on top of the substrate assembly by placing the ultra-thin material layer or bonding layer of the carrier assembly into contact with the thermally isolating material layer of the substrate assembly; (d) bonding the carrier assembly to the substrate assembly to provide a bonded stack; (e) removing the carrier layer and optional sacrificial layer from the bonded stack to provide a sensor wafer, the sensor wafer comprising the substrate layer, the thermally isolating material layer on the top surface of the substrate layer, the optional bonding layer on the thermally isolating material layer, and the ultra-thin material layer on the optional bonding layer or on the thermally isolating material layer; and (f) structuring the sensor wafer to provide the unreleased thermopile infrared sensor, wherein the thermally isolating material layer is stable at temperatures up to 450° C., and the ultra-thin material layer is fabricated of one or more materials having a thickness of less than or equal to 200 nm and is deposited by methods requiring a heightened temperature of greater than 450° C.

According to some embodiments, the substrate layer comprises one or more materials that are unstable at temperatures greater than 450° C. In some embodiments, the substrate layer is a CMOS wafer, a printed circuit board (PCB), or a flexible substrate that is unstable at temperatures greater than 450° C. In some embodiments, the carrier substrate is fabricated of silicon. In some embodiments, the carrier substrate is fabricated of a material that is stable under conditions at which the ultra-thin material layer is deposited. In some embodiments, the thermally isolating material layer is fabricated of one or more materials selected from the group consisting of Parylene, benzocyclobutene (BCB), amorphous fluoropolymers, poly(methyl methacrylate), SU-8 photo-resists, and other polymers. In some embodiments, the ultra-thin material layer is fabricated of one or more 2D materials. In some embodiments, the ultra-thin material layer is fabricated of one or more materials selected from the group consisting of graphene, $MoS_2$, SnSe, black phosphorus (BP), thin poly-silicon, SiGe (silicon germanium), Ge (germanium), boron nitride (BN), group III-V compound semiconductors, and group II-VI compound semiconductors. In some embodiments, the optional bonding layer is fabricated of one or more polymeric materials that are stable at temperatures up to 450° C. In some embodiments, the step of bonding the carrier assembly to the substrate assembly is carried out using polymer bonding, low temperature direct bonding, fusion bonding, and/or thermo-compression bonding. In some embodiments, the carrier layer and sacrificial layer are removed from the bonded stack by selective etching of the sacrificial layer. In some embodiments, prior to selective etching, a wafer grinding process is performed to remove a bulk of the carrier wafer.

According to another aspect, the present invention is directed to a method for fabricating an unreleased thermopile infrared sensor comprising: (a) forming a substrate assembly by providing a substrate layer having a bottom surface and a top surface, and depositing a thermally isolating Parylene material layer on at least a portion of the top surface of the substrate layer; (b) forming a carrier assembly by providing a carrier layer having a bottom surface and a top surface, depositing a sacrificial layer on at least a portion of the top surface of the carrier layer, depositing a 2D material layer on at least a portion of the sacrificial layer, and optionally depositing a bonding layer on the 2D material layer; (c) stacking the carrier assembly on top of the substrate assembly by placing the 2D material layer or bonding layer of the carrier assembly into contact with the thermally isolating Parylene material layer of the substrate assembly; (d) bonding the carrier assembly to the substrate assembly to provide a bonded stack; (e) removing the carrier layer and sacrificial layer from the bonded stack to provide a sensor wafer, the sensor wafer comprising the substrate layer, the thermally isolating Parylene material layer on the top surface of the substrate layer, the optional bonding layer on the thermally isolating Parylene material layer, and the 2D material layer on the optional bonding layer or on the thermally isolating Parylene material layer; and (f) structuring the sensor wafer to provide the unreleased thermopile infrared sensor, wherein the thermally insulating Parylene material layer is stable at temperatures up to 450° C.

Other aspects, embodiments and advantages of the present invention will become readily apparent to those skilled in the art. As will be realized, the present invention is capable of other and different embodiments without departing from the present invention. Thus the following description as well as any drawings appended hereto shall be regarded as being illustrative in nature and not restrictive.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principals of the invention. The components in the drawings are not necessarily to scale, emphasis instead being placed upon clearly illustrating the principles of the present invention. In the drawings, each like component is referenced by a like numeral. For purposes of clarity, every component may not be labeled in every drawing. In the drawings.

DETAILED DESCRIPTION OF THE INVENTION

Figure 1:
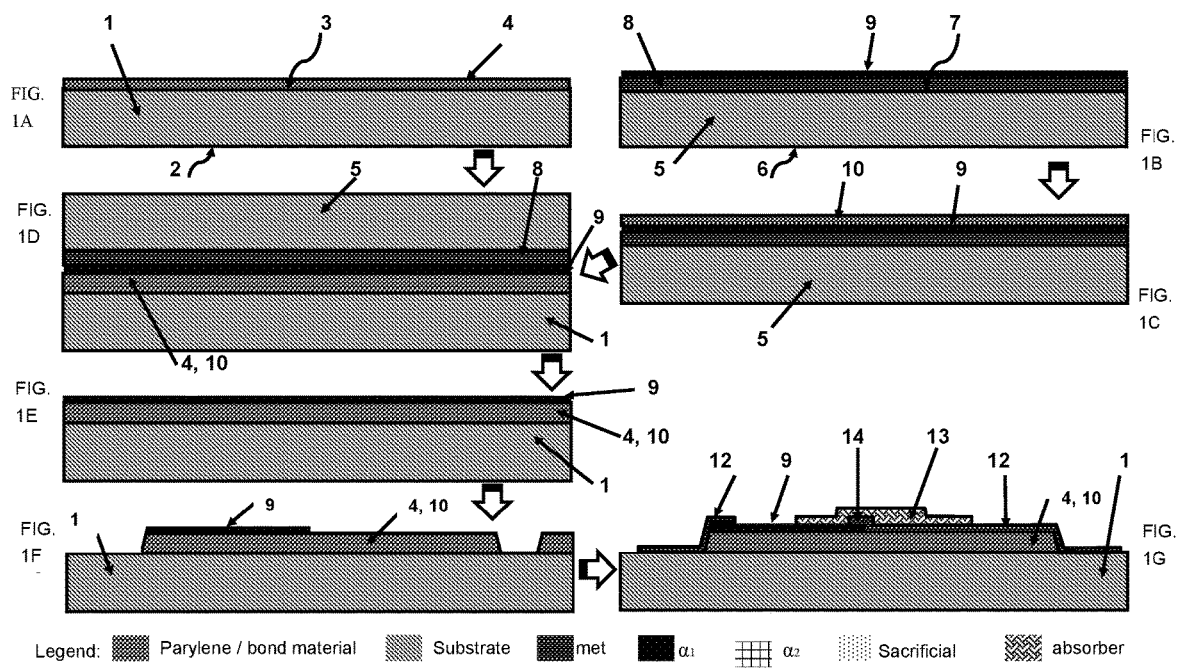
FIGS. 1A-1G illustrate a process for making an IR sensor having a single 2D material based sensor in accordance with one embodiment of the present invention.

According to the present invention, a thermopile IR sensor and a fabrication method is provided which makes it possible to eliminate the need for a suspended membrane structure ("released" membrane) while still providing enhanced sensitivity. Such thermopile IR sensors are more durable, and are also less complex, costly, and time consuming to fabricate. The thermopile IR sensors of the invention have even been shown to outperform current TP sensor designs based on polycrystalline silicon ("poly-Si").

The present invention achieves such properties by the use of new thermally isolating materials in combination with ultra-thin materials. In particular, according to embodiments of the invention, a thermopile IR sensor is formed by disposing these new thermally isolating materials between an ultra-thin material based sensor and the substrate.

According to the present invention, the "new thermally isolating materials" (which may also be referred to herein as simply "thermally isolating materials" or "thermal isolation materials") are polymeric materials that possess very low thermal conductivity as compared to conventional materials, particularly thermal conductivities of less than about 1 W/mK, and are further stable at heightened temperatures, particularly temperatures up to about 450° C. (i.e., heightened temperatures that are lower than 450° C.). Examples of such thermally isolating materials include, but are not limited to Parylene (which includes all forms of Parylene, such as Parylene HT, Parylene N, Parylene C, etc., and can collectively be referred to as "Parylene"), benzocyclobutene (BCB), Cytop™ (amorphous fluoropolymers which can encompasses primary (RPH2), secondary (R2PH), and tertiary (R3P) alkylphosphines where R is linear, branched, cyclic, or which can also contain functional groups), poly (methyl methacrylate), and SU-8 photo-resists.

For example, the thermal conductivity of Parylene C is 0.084 W/mK, the thermal conductivity of Parylene HT is 0.096 W/mK, and the thermal conductivity of Parylene N is 0.126 W/mK. These values are almost seventeen times lower, almost fifteen times lower and over eleven times lower than $SiO_2$ (1.4 W/mK), respectively. As such, the use of Parylene and other similar thermally isolating materials of the present invention allows for enhanced concentration of heat within the sensor rather than dissipation from the sensor. Further, newly developed forms of Parylene, particularly Parylene HT, are stable at heightened temperatures up to 450° C. This makes the use of Parylene compatible with standard processes in which such heightened temperatures are commonly used. This is in contrast with many conventional materials, which become unstable at heightened temperatures, thus making them unusable with standard processes, such as CMOS processes.

As referred to herein, the "ultra-thin materials" include any materials having a thickness of less than or equal to 200 nm, preferably less than or equal to 100 nm. According to embodiments of the present invention, the ultra-thin materials are further characterized in that they are fabricated and deposited at temperatures in excess of 450° C. According to some embodiments, the ultra-thin materials are 2-dimensional (2D) materials. As referred to herein, "2D materials" are generally understood to include materials that have an extremely small thickness in relation to their overall size. More particularly, 2D materials are understood to refer to materials having a thickness of a few nanometers or less, including atomically thin materials which have a thickness of a single atom or a few atoms. Some examples of 2D materials include, but are not limited to, graphene, $MoS_2$, tin selenide (SnSe), black phosphorus (BP), thin poly-silicon (≤200 nm), SiGe (silicon germanium), Ge (germanium), boron nitride (BN), group III-V compound semiconductors (e.g., boron nitride (BN), boron phosphide (BP), boron arsenide (BAs), aluminum nitride (AlN), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), Indium antimonide (InSb)), and group II-VI compound semiconductors (e.g., cadmium selenide (CdSe), cadmium sulfide (CdS), cadmium telluride (CdTe), zinc oxide (ZnO), zinc selenide (ZnSe), zinc sulfide (ZnS), and zinc telluride (ZnTe)). The use of such materials beneficially increases the detectivity of the IR sensor.

Recently, exceptional Seebeck coefficients have been reported for 2D materials. In addition, 2D materials provide outstanding thermoelectric properties (e.g., as high as $10^5$ $uVK^{-1}$ for $MoS_2$). As such, it is possible to generate more thermoelectric power using 2D materials than with conventional materials, such as poly-silicon which provides thermoelectric properties of about $10^2$ $uVK^{-1}$. Further, by using 2D material based sensors according to embodiments of the present invention, vacuum packaging and complex doping steps can be omitted, thus making the manufacturing process much simpler.

However, while the use of ultra-thin and 2D material based sensors provides numerous advantages, such materials still result in rapid dissipation of the absorbed IR light heat into the substrate, thereby not allowing the sensor to heat up sufficiently. Thus, a structure in which 2D materials are used in a thermopile IR sensor still requires the use of a suspended ("released") membrane in order to minimize dissipation and increase sensitivity of the sensor.

According to the present invention, in addition to using ultra-thin materials, such as 2D materials, the new thermally isolating materials are provided. In particular, the new thermally isolating materials are disposed between the ultra-thin material based sensor and the substrate, thereby creating thermal isolation of the ultra-thin material based sensor to the substrate. By combining the thermally isolating materials, which possess very low thermal conductivity, with the ultra-thin materials, which provide exceptional Seebeck coefficients and outstanding thermoelectric properties, it is possible to provide a thermopile IR sensor in which membrane suspension ("release") is not required in order to prevent fast dissipation of heat into the substrate. As such, the sensor of the present invention is allowed to heat up sufficiently to thereby provide excellent sensitivity.

The formation of a thermopile IR sensor that combines both ultra-thin materials and the new thermally isolating materials, such as a combination of 2D materials and Parylene, is extremely difficult and has not been achieved to date. Most ultra-thin materials, such as 2D materials, are grown using chemical vapor deposition (CVD). CVD is a process that must be carried out at temperatures as high as 700° C. This heightened temperature is a serious restriction, due to the temperatures at which Parylene becomes unstable. Further, CMOS wafers, printed circuit boards (PCB) and most flexible substrates on which the ultra-thin and 2D materials must be grown in order to form the sensor are likewise limited in their allowable temperature exposure. In particular, such materials generally remain stable up to a maximal temperature exposure of 450° C. As a result, growth of ultra-thin and 2D materials onto such materials is not possible.

The present invention overcomes these obstacles by providing a wafer transfer technique that allows for the formation of a structure including both ultra-thin materials with heightened temperature restrictions and the new thermally isolating materials. Further, the present techniques make it possible to provide the ultra-thin materials and thermally isolating materials on any desired substrate material, including CMOS wafers, PCBs, flexible substrates, conventional substrate materials, and materials that have heightened temperature limitations.

In general, the present method deposits the new thermally isolating materials on a desired substrate material (also referred to herein as a substrate wafer), and separately deposits the ultra-thin material on a carrier substrate (also referred to herein as a carrier wafer). As such, the ultra-thin material can be deposited under the necessary heightened temperatures without exposing the new thermally isolating materials, or the substrate on which the new thermally isolating materials are deposited, to such heightened temperatures. Subsequently, the carrier wafer on which the ultra-thin material has been deposited is bonded to the substrate wafer on which the new thermally isolating material has been deposited. According to various embodiments, this bond is formed using Parylene. However, any conventional bonding techniques may be used, including, but not limited to, low temperature direct bonding, fusion, thermo-compression, and various polymer bonding techniques. After bonding, the carrier wafer can be removed using selective etching or any other suitable mechanisms. Thereafter, the sensor material can be structured as needed for the desired end use.

Referring now to the various figures of the drawing wherein like reference characters refer to like parts, there is shown in FIGS. 1A-1G, one example of a process for fabricating a thermocouple including a single 2D material layer. In this embodiment, the thermally isolating material is Parylene, the ultra-thin material is a 2D material, and the bonding material is Parylene. However, any other thermally isolating materials, ultra-thin materials, and bonding materials could suitably be used in place of Parylene and a 2D material.

As shown in FIG. 1A, a substrate 1 is provided having a bottom surface 2 and a top surface 3. This substrate 1 can be fabricated of any conventional substrate materials, including materials that may become unstable at heightened temperatures, such as the heightened temperatures at which ultra-thin materials such as 2D materials are deposited. Some examples of the substrate 1 include, but are not limited to, CMOS wafers, printed circuit boards (PCB), polymer substrates, flexible substrates, and silicon/germanium/quartz-wafers. In particular, as shown in the depicted embodiment, in FIG. 1A Parylene 4 is deposited on the top surface 3 of the substrate 1. This deposition can be carried out using any conventional method.

As shown in FIG. 1B, a separate carrier substrate 5 is provided having a bottom surface 6 and a top surface 7. As depicted, a sacrificial layer 8 may first be provided on the top surface 7 of the carrier substrate 5. This sacrificial layer 8 is optional, but it may make subsequent removal of the carrier substrate 5 easier, and it may further serve as a protective layer, for example, if another etch technique is used to remove the carrier substrate (e.g. DRIE or other wet etch techniques). The 2D material 9 is then grown on the sacrificial layer 8 or directly on the carrier substrate 5 top surface 7 if no sacrificial layer 8 is used. In some embodiments, an intermediate layer (not shown) may optionally be provided below the sacrificial layer 8 for better adhesion. In some embodiments, a protective layer (not shown) may optionally be provided on top of the sacrificial layer 8 to protect the 2D material against the sacrificial layer etching step. The sacrificial layer 8 is labeled as a metal, since in an exemplary embodiment the sacrificial layer 8 is copper, which will be etched away using metal wet etching to remove the carrier substrate 5 of the carrier wafer. In the case of using other etching techniques (e.g. DRIE), the sacrificial layer 8 may be formed as a protective layer, such as SiO2, which acts as an etch stop rather than sacrificial layer. In such embodiments, this layer needs to be removed in a subsequent step to electrically connect the 2D material layer using metal deposition. According to the present invention, the carrier substrate 5 can be formed of silicon or any other conventional materials that allow for deposition of an ultra-thin material 9 thereon either directly or via a sacrificial layer 8 and/or intermediate layer. As such, the material forming the carrier substrate 5 should be stable at the required conditions at which deposition of these layers is carried out.

Next, as shown in FIG. 1C, a bonding layer 10 is deposited by any conventional deposition methods on top of the 2D material layer 9 so as to allow for bonding of the two wafer/substrate assemblies of FIG. 1A and FIG. 1C together. This bonding layer 10 can be Parylene, any other thermally isolating material, or any other conventional bonding material, including amorphous and polymer based bonding materials. There are not particular limitations to the selection of the material used as the bonding layer 10, provided that the overall Parylene/bonding layer is thick enough to guarantee thermal isolation. In some embodiments, a bonding layer 10 is not provided, and the Parylene 4 layer provided on the substrate 1 of FIG. 1A is utilized as a bonding material.

Next, as shown in FIG. 1D, the Parylene 4 layer of FIG. 1A and the bonding layer 10 of FIG. 1C are placed in contact with each other and the two wafer stacks are bonded together. For example, the carrier wafer assembly in FIG. 1C may be flipped upside down and stacked on top of the substrate wafer assembly of FIG. 1A, as shown in FIG. 1D. Of course, any other method can be used so as to provide the two wafer assemblies of FIG. 1A and 1C in the stacked arrangement and to allow for them to be bonded together (e.g., the substrate wafer assembly of FIG. 1A can be flipped upside down and stacked on top of the carrier wafer assembly in FIG. 1C, the two wafer assemblies of FIGS. 1A and 1C can be stacked together side by side, etc.). Any variety of bonding techniques can be used, including but not limited to, polymer bonding, low temperature direct bonding, and thermo-compression bonding. As shown in the depicted embodiment, the Parylene 4 layer of FIG. 1A and the bonding layer 10 of FIG. 1C are placed in contact with each other and bonded together. Such bonding can be carried out under heightened temperature, application of pressure, and/or possibly $O_2$ plasma treatment. Alternatively, when no bonding layer 10 is provided, the Parylene 4 layer of FIG. 1A and the 2D material 9 layer of FIG. 1C are placed in contact with each other and bonded together by applying pressure.

After bonding, the carrier wafer 5 is removed using selective etching or any other conventional process to thereby provide the sensor wafer structure as shown in FIG. 1E. As shown, this structure includes the substrate 1, the Parylene 4 layer provided on the top surface 3 of the substrate 1, a further Parylene 10 layer as a bonding material (if the bonding layer 10 is provided), followed by the 2D material 9. For example, in some embodiments, the carrier wafer 5 may be removed by selectively etching the sacrificial layer 8 using, for example, metal, $SiO_2$ or other selective etching processes. This process removes both the sacrificial layer 8 and the attached carrier wafer 5. In some embodiments, prior to the selective etching processes, a wafer grinding process or the like can be performed to remove the bulk of the carrier wafer. Of course, as it would be readily understood by one skilled in the art, any other conventional techniques could alternatively be used to remove the carrier wafer 5 and the sacrificial layer 8, if provided.

After removal of the sacrificial layer 8 (if included) and the carrier wafer 5, structuring of the sensor wafer can then be performed. For example, as shown in FIG. 1F, Parylene 4, the bonding layer 10 (which is Parylene in this embodiment), and the 2D material 9 are structured, with the 2D material 9 forming the sensor, to provide a thermal connection to the substrate 1. Further, electroplating or metal sputtering is performed to create a thermal stud. In particular, a sputtering process can be carried out so as to connect the thermocouple together and, at the same time, create the thermal contact to the carrier substrate 1. For a single 2D material sensor, the thermocouple can be formed by the 2D material 9 and the sputtered metal α2. While electroplating may be used, this process requires a seed layer, which might result in short-circuiting the sensor. Thus, metal sputtering is preferred. A cold junction of the sensor can then be achieved by thermally connecting the outer sensor part with the substrate 1 through metallization. For example, metal sputtering can be performed to deposit metal 12 which connects the 2D material 9 electrically and forms the thermocouple. At the same time, this establishes thermal contact between the 2D material 9 and the substrate 1, thus forming a cold junction area at the thermopile sensor.

In the resulting structure, the metal 12 acts as a Seebeck coefficient material. An absorber 13 is further deposited as an upper layer so as to absorb IR radiation. The absorber 13 can be fabricated of any conventional materials, including but not limited to, interferometric and organic materials, and can further be sized and configured in accordance with conventional absorbers.

FIGS. 2A-2G depict another embodiment of the present invention in which the fabrication process is similar to the process depicted in FIGS. 1A-1G. The main difference in the embodiment depicted by FIGS. 2A-2G is that a double 2D material layer thermocouple is provided by this embodiment rather than the single 2D material layer thermocouple which is provided by FIGS. 1A-1G. As such, in FIG. 2B, a first 2D material 29 and a second 2D material 30 are deposited on the carrier wafer 25 rather than deposition of the single 2D material 9 as shown in FIG. 1B. The first 2D material 29 and the second 2D material 30 can be, for example, two different 2D or ultrathin materials, wherein "different" 2D or ultrathin materials mean that they possess different Seebeck coefficients. The remainder of the process steps in FIG. 2A-2G may be similar to or essentially the same as those described above in connection with FIGS. 1A-1G.

Figure 2:
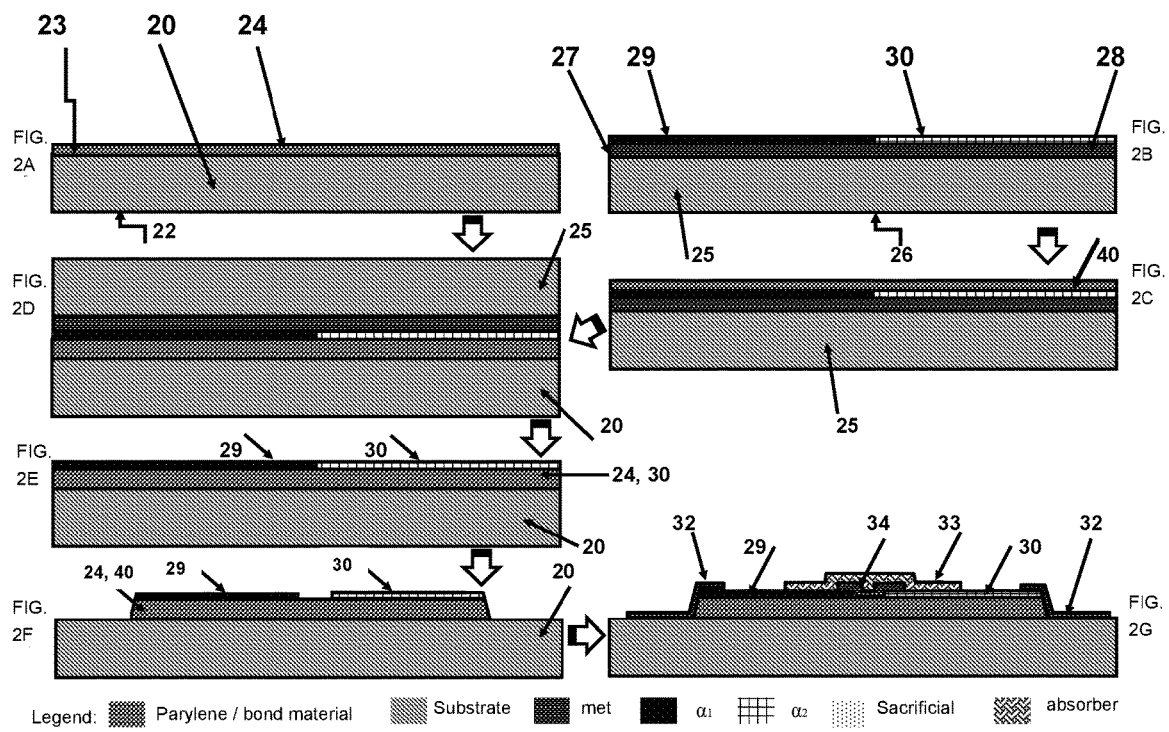
FIGS. 2A-2G illustrate a process for making an IR sensor having a double 2D material based sensor in accordance with another embodiment of the present invention.

In particular, in FIG. 2A, Parylene 24 is deposited on a top surface 23 of a substrate wafer 20. In FIG. 2B, a sacrificial layer 28 may optionally be deposited on a top surface 27 of a carrier wafer 25. A first 2D material 29 is subsequently deposited on a portion of the sacrificial layer 28 (or directly onto the carrier wafer 20 if a sacrificial layer 28 is not provided), such as on a left side. A second 2D material 30 is, likewise, deposited on another portion of the sacrificial layer (or directly onto the carrier wafer 20 if a sacrificial layer 28 is not provided), such as on a right side. Of course, it will be understood by those skilled in the art that any arrangement of any number of 2D materials (in addition to the structure specifically shown in FIGS. 2A-2G) could be used and determined based on the desired end structure. A bonding layer 28 (which may be Parylene, a thermally isolating material, or any conventional bonding material), is then optionally deposited on top of the 2D materials 29, 30 as shown in FIG. 2C. Thereafter, the carrier wafer assembly in FIG. 2C is flipped upside down and stacked on top of the substrate wafer assembly formed in FIG. 2A (or, as noted above in connection with FIG. 2D, any other method can be used so as to stack the substrate wafer assembly of FIG. 2A and the carrier wafer assembly of FIG. 2C together). The carrier wafer assembly and the substrate wafer assembly are then bonded together using any variety of bonding techniques to provide the structure of FIG. 2D. After bonding, the carrier wafer 25 is removed using selective etching or any other conventional process to thereby provide the sensor wafer structure as shown in FIG. 2E. As shown, the sensor wafer structure includes the substrate 20, the Parylene 24 layer provided on the top surface 23 of the substrate 20, a further Parylene 40 layer as a bonding material, followed by the 2D materials 29, 30.

After removal of the sacrificial layer 28 (if included) and the carrier wafer 25, structuring of the sensor wafer shown in FIG. 2E can then be performed. For example, as shown in FIG. 2F, Parylene 24, the bonding layer 40 and the 2D materials 29, 30 are structured, with the 2D materials 29, 30 forming the sensor, to provide a thermal connection to the substrate 1. Further, electroplating is performed to create a thermal stud, and a cold junction of the sensor can then be achieved by thermally connecting the outer sensor part with the substrate 20 through metallization. For example, metal sputtering can be performed to deposit metal 32 which connects the 2D materials 29, 30 electrically and forms the thermocouple. At the same time, this establishes thermal contact between the 2D materials 29, 30 and the substrate 20, thus forming a cold junction area at the thermopile sensor. An absorber 33 is further deposited as an upper layer so as to absorb IR radiation.

Figure 3:
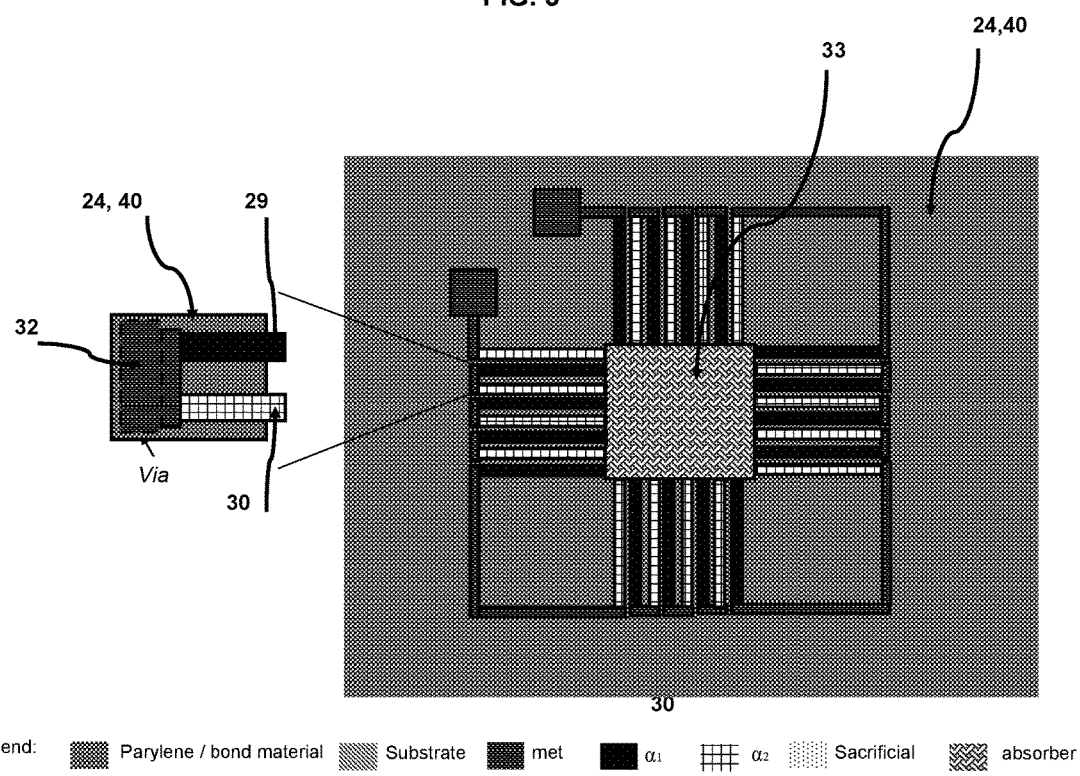
FIG. 3 illustrates a top view of a thermopile IR sensor in accordance with one embodiment of the present invention.

FIG. 3 depicts a top view of a thermopile IR sensor according to an embodiment of the present invention which includes a double 2D material layer 29, 30 as a thermocouple, and Parylene 24 (and optionally Parylene 40 when used as a bonding material) as a thermally isolating material disposed between the 2D material layer 29, 30 and substrate 20. The thermopile IR sensor depicted can be fabricated, for example, in accordance with the embodiment shown in FIG. 2A-2G. It is noted that the substrate 20 is not depicted in this view because it is positioned directly below the Parylene layers 29, 30.

Figure 4:
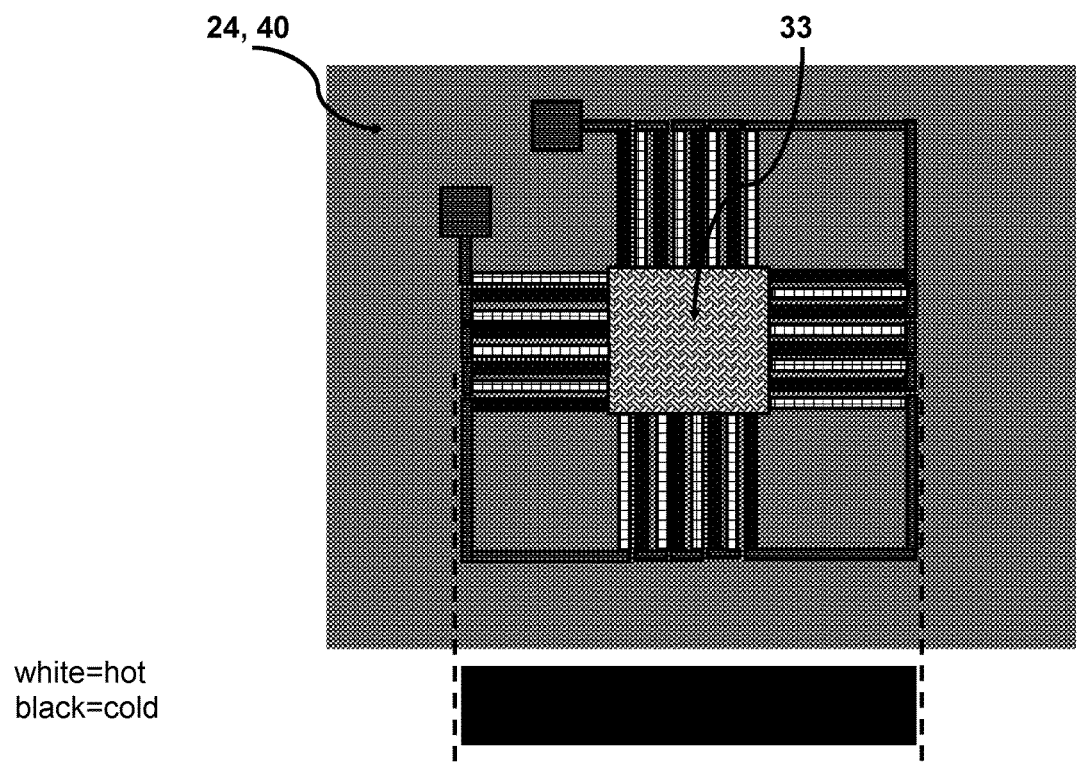
FIG. 4 illustrates the sensor temperature profile of the FIG. 3 thermopile IR sensor after IR absorption.
Figure 5:
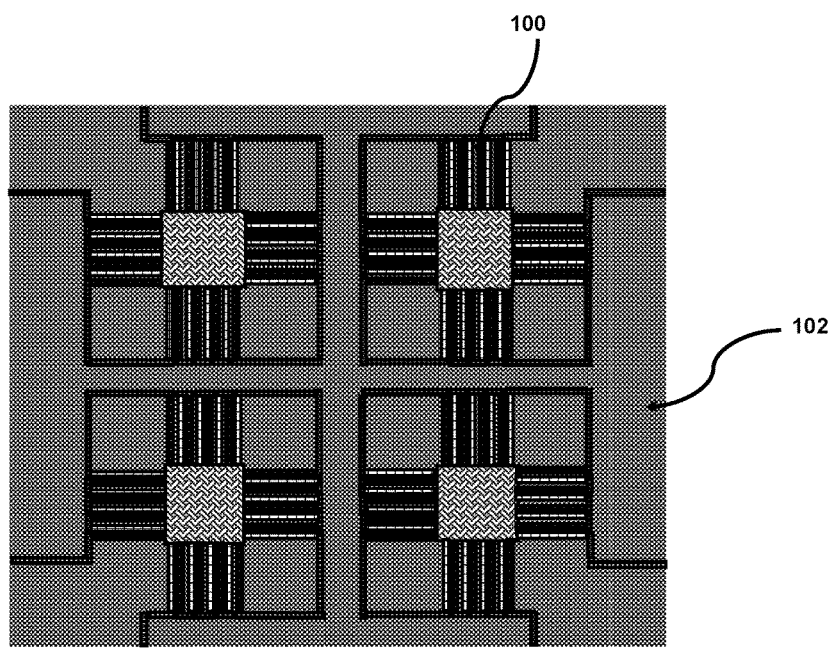
FIG. 5 illustrates a top view of a thermopile array in accordance with one embodiment of the present invention, in which four of the FIG. 3 thermopile IR sensors are provided.

The temperature profile of the structure shown in FIG. 3 is further depicted in FIG. 4. In particular, the figure shows the heat distribution within the sensor upon incoming radiation of IR light. First the IR-light will be converted into heat by the absorber layer. Afterwards the heat spreads over the entire structure. Depicted is a steady state, and as demonstrated, the heat spread has reached saturation after a curtain time. As shown, most of the heat is concentrated at the middle of the sensor, and there is a temperature difference between the middle of the sensor and the edge. This temperature difference, together with the Seebeck coefficient difference of the 2D materials is creating a voltage output. Generally, the larger the temperature difference the better According to embodiments of the present invention, the thermopile IR sensor can comprise several thermocouples, which are electrically connected in series. An array of thermopile sensors can further be built. For example, a plurality of thermocouples 100 can be electrically connected to provide a thermopile array 102 such as that shown in FIG. 5. In particular, FIG. 5 depicts an array of four thermopile IR sensors, which may be sensors in accordance with the embodiment shown in FIG. 3, arranged in two rows. Of course, while the thermopile array 102 is depicted as comprising four thermopile IR sensors arranged in two rows, one or ordinary skill will appreciate that any number of thermopile IR sensors may be included and arranged in any desired configuration.

By using the present wafer/substrate bonding methods, ultra-thin materials can be grown at the requisite temperatures of up to 700° C., while overcoming the thermal instability issues of Parylene and other thermally isolating materials, as well as the allowable temperature budget for fabricating various wafers. The present wafer bonding methods can also be used to directly bond a thermopile sensor on any substrate, including but not limited to, silicon wafers, CMOS wafers, a printed circuit boards (PCB) and other desired flexible substrates, which may even have heightened temperature restrictions. Some examples of flexible substrates include, but are not limited to polyimide, PEEK (Polyether ether ketone) and transparent conductive polyesters. Such methods are beneficial because there is a challenge to integrating a CVD grown material onto a CMOS wafer, PCB or flexible substrate having a maximum allowable temperature of 450° C. The present invention makes it possible to fabricate such structures regardless of temperature restrictions by growing the desired material on a first wafer at the requisite heightened temperature, followed by subsequently bonding the grown material to the CMOS wafer, PCB or flexible substrate. Still further, the present materials and methods allow for the use of a thinner substrate and, thus, for applications where mechanical flexibility of the sensor is required, such structures can now be realized.

In addition, the present invention provides for the possibility of thermally isolating the sensor using novel materials, such as Parylene, which makes it unnecessary to suspend/release the membrane in order to achieve a high sensitivity. As a result, the overall fabrication process is simplified and the resulting structure is very robust for the subsequent handling and packaging steps. This will lead to cost reductions due to a higher yield of products and a simpler manufacturing process.

The methods and devices provided by the present invention will find great use in a variety of applications, including all known thermopile array types, especially in small array applications, air conditioning systems, the automotive industry, consumer electronics, presence and motion detection, people counting, and wearable sensors.

It will be apparent to those skilled in the art that various modifications and variations can be made to the structure of the present invention without departing from the scope or spirit of the invention.

In view of the foregoing, it is intended that the present invention cover modifications and variations of this invention provided they fall within the scope of the following claims and their equivalents.

What is claimed is:

1. An unreleased thermopile infrared sensor comprising:
   a substrate having a bottom surface and a top surface;
   a thermally isolating material disposed on at least a portion of the top surface of the substrate, the thermally isolating material having a bottom surface and a top surface; and
   an ultra-thin material disposed on at least a portion of the top surface of the thermally isolating material;
   wherein the thermally isolating material is stable at temperatures up to 450° C., and
   wherein the ultra-thin material is selected from materials having a thickness of less than or equal to 200 rim, and are deposited by methods requiring a heightened temperature of greater than 450° C.

2. The unreleased thermopile infrared sensor of claim 1, wherein the thermally isolating material is selected from Parylene, benzocyClobutene (BCB), amorphous fluoropolymers, poly(methyl methacrylate), SU-8 photo-resists, and other polymers.

3. The unreleased thermopile infrared sensor of claim 1, wherein the ultra-thin material is selected from 2D materials.

4. The unreleased thermopile infrared sensor of claim 3, wherein the ultra-thin material is selected from the group consisting of grapheme, $MoS_2$, SnSe, black phosphorus (BP), thin poly-silicon, SiGe (silicon germanium), Ge (germanium), boron nitride (BN), group III-V compound semiconductors, group II-VI compound semiconductors, and combinations thereof.

5. The unreleased thermopile infrared sensor of claim 1, further comprising a second ultra-thin material disposed on at least another portion of the top surface of the thermally isolating material.

6. The unreleased thermopile infrared sensor of claim 1, wherein the substrate is selected from a silicon wafer, a CMOS wafer, a printed circuit board, or a flexible substrate that is unstable at temperatures in excess of 450° C.

7. An unreleased thermopile infrared sensor comprising:
   a Parylene material disposed between a 2D material based sensor and a substrate, wherein the Parylene material is stable at temperatures up to 450° C., and the 2D material is deposited by methods requiring a heightened temperature of greater than 450° C.

8. The unreleased thermopile infrared sensor of claim 7, wherein the substrate is selected from a silicon wafer, a CMOS wafer, a printed circuit board, or a flexible substrate that is unstable at temperatures in excess of 450° C.

9. A method for fabricating an unreleased thermopile infrared sensor comprising:
   (a) forming a substrate assembly by providing a substrate layer having a bottom surface and a top surface, and depositing a thermally isolating material layer on at least a portion of the top surface of the substrate layer;
   (b) forming a carrier assembly by providing a carrier layer having a bottom surface and a top surface, optionally depositing a sacrificial layer on at least a portion of the top surface of the carrier layer, depositing an ultra-thin material layer on at least a portion of the sacrificial layer or on at least a portion of the top surface of the carrier layer, and optionally depositing a bonding layer on the ultra-thin material;
   (c) stacking the carrier assembly on top of the substrate assembly by placing the ultra-thin material layer or bonding layer of the carrier assembly into contact with the thermally isolating material layer of the substrate assembly;
   (d) bonding the carrier assembly to the substrate assembly to provide a bonded stack;
   (e) removing the carrier layer and optional sacrificial layer from the bonded stack to provide a sensor wafer, the sensor wafer comprising the substrate layer, the thermally isolating material layer on the top surface of the substrate layer, the optional bonding layer on the thermally isolating material layer, and the ultra-thin material layer on the optional bonding layer or on the thermally isolating material layer; and
   (f) structuring the sensor wafer to provide the unreleased thermopile infrared sensor,
   wherein the thermally isolating material layer is stable at temperatures up to 450° C., and the ultra-thin material layer is fabricated of one or more materials having a thickness of less than or equal to 200 nm and is deposited by methods requiring a heightened temperature of greater than 450° C.

10. The method of claim 9, wherein the substrate layer comprises one or more materials that are unstable at temperatures greater than 450° C.

11. The method of claim 9, wherein the substrate layer is a CMOS wafer, a printed circuit board (PCB), or a flexible substrate that is unstable at temperatures greater than 450"C.

12. The method of claim 9, wherein the carrier substrate is fabricated of silicon.

13. The method of claim 9, wherein the carrier substrate is fabricated of a material that is stable under conditions at which the ultra-thin material layer is deposited.

14. The method of claim 9, wherein the thermally isolating material layer is fabricated of one or more materials selected from the group consisting of Parylene, benzocyclobutene (BCB), amorphous fluoropolymers, poly(methyl methacrylate), SU-8 photo-resists, and other polymers.

15. The method of claim 9, wherein the ultra-thin material layer is fabricated of one or more 2D materials.

16. The method of claim 9, wherein the ultra-thin material layer is fabricated of one or more materials selected from the group consisting of graphene, $MoS_2$, SnSe, black phosphorus (BP), thin poly-silicon, SiGe (silicon germanium), Ge (germanium), boron nitride (BN), group III-V compound semiconductors, and group II-VI compound semiconductors.

17. The method of claim 9, wherein the optional bonding layer is fabricated of one or more polymeric materials that are stable at temperatures up to 450° C.

18. The method of claim 9, wherein the step of bonding the carrier assembly to the substrate assembly is carried out using polymer bonding, low temperature direct bonding, fusion bonding, and/or thermo-compression bonding.

19. The method of claim 9, wherein the carrier layer and sacrificial layer are removed from the bonded stack by selective etching of the sacrificial layer.

20. The method of claim 19, wherein prior to selective etching, a wafer grinding process is performed to remove a bulk of the carrier wafer.

21. A method for fabricating an unreleased thermopile infrared sensor comprising:
(a) forming a substrate assembly by providing a substrate layer having a bottom surface and a top surface, and depositing a thermally isolating Parylene material layer on at least a portion of the top surface of the substrate layer;
(b) forming a carrier assembly by providing a carrier layer having a bottom surface and a top surface, depositing a sacrificial layer on at least a portion of the top surface of the carrier layer, depositing a 2D material layer on at least a portion of the sacrificial layer, and optionally depositing a bonding layer on the 2D material layer;
(c) stacking the carrier assembly on top of the substrate assembly by placing the 2D material layer or bonding layer of the carrier assembly into contact with the thermally isolating Parylene material layer of the substrate assembly;
(d) bonding the carrier assembly to the substrate assembly to provide a bonded stack;
(e) removing the carrier layer and sacrificial layer from the bonded stack to provide a sensor wafer, the sensor wafer comprising the substrate layer, the thermally isolating Parylene material layer on the top surface of the substrate layer, the optional bonding layer on the thermally isolating Parylene material layer, and the 2D material layer on the optional bonding layer or on the thermally isolating Parylene material layer; and
(f) structuring the sensor wafer to provide the unreleased thermopile infrared sensor,
wherein the thermally insulating Parylene material layer is stable at temperatures up to 450° C.

* * * * *